(12) United States Patent
Chung et al.

(10) Patent No.: US 7,378,864 B2
(45) Date of Patent: May 27, 2008

(54) TEST APPARATUS HAVING MULTIPLE TEST SITES AT ONE HANDLER AND ITS TEST METHOD

(75) Inventors: Ae-Yong Chung, Chungcheongnam-do (KR); Sung-Ok Kim, Chungcheongnam-do (KR); Kyeong-Seon Shin, Kyunggi-do (KR); Jeong-Ho Bang, Kyunggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 60 days.

(21) Appl. No.: 11/092,067

(22) Filed: Mar. 28, 2005

(65) Prior Publication Data

US 2005/0168236 A1    Aug. 4, 2005

Related U.S. Application Data

(62) Division of application No. 10/672,994, filed on Sep. 25, 2003, now Pat. No. 6,903,567.

(30) Foreign Application Priority Data

Sep. 26, 2002   (KR) ............................... 2002-58349

(51) Int. Cl.
   G01R 31/26   (2006.01)
   G01R 31/28   (2006.01)
(52) U.S. Cl. ................... 324/765; 324/73.1; 324/158.1
(58) Field of Classification Search .................... None
   See application file for complete search history.

(56) References Cited

U.S. PATENT DOCUMENTS

| 3,664,499 | A | * | 5/1972 | Sahakian | ..................... 209/573 |
|---|---|---|---|---|---|
| 5,126,656 | A | * | 6/1992 | Jones | ......................... 324/760 |
| 5,151,903 | A | * | 9/1992 | Mydill et al. | ............... 714/743 |
| 5,390,129 | A | | 2/1995 | Rhodes | |
| 5,778,386 | A | | 7/1998 | Lin et al. | |
| 5,794,175 | A | * | 8/1998 | Conner | ....................... 702/119 |
| 5,796,246 | A | * | 8/1998 | Poh et al. | .................. 324/73.1 |
| 5,913,020 | A | * | 6/1999 | Rohwer | .......................... 714/8 |
| 6,043,101 | A | | 3/2000 | Stubblefield et al. | |
| 6,078,188 | A | * | 6/2000 | Bannai et al. | .............. 324/765 |
| 6,184,675 | B1 | * | 2/2001 | Bannai | ..................... 324/158.1 |
| 6,313,652 | B1 | * | 11/2001 | Maeng | ....................... 324/760 |

(Continued)

OTHER PUBLICATIONS

English language abstract of Korean Publication No. 1020010084288.

(Continued)

*Primary Examiner*—Paresh Patel
(74) *Attorney, Agent, or Firm*—Marger Johnson & McCollom, P.C.

(57) ABSTRACT

A test apparatus includes one handler connected to a tester and one test board divided into two or more sites or two or more test boards. Since only the sites on the test board (or test boards) need be duplicated, rather than the loading lanes or sorters of the handler, the test apparatus can be conveniently compact. Further, while testing semiconductor devices on one site or one test board, semiconductor devices in another site or on another test board can be sorted according to the test result. This enables the reduction or elimination of tester idle time to optimize the efficiency of the test apparatus.

4 Claims, 6 Drawing Sheets

U.S. PATENT DOCUMENTS

| | | | |
|---|---|---|---|
| 6,477,095 B2 * | 11/2002 | White et al. | 365/201 |
| 6,563,070 B2 | 5/2003 | Capser | |
| 6,563,331 B1 * | 5/2003 | Maeng | 324/760 |
| 6,815,233 B1 | 11/2004 | Erhardt et al. | |
| 6,819,129 B2 * | 11/2004 | Kim et al. | 324/755 |
| 6,888,366 B2 * | 5/2005 | Kim et al. | 324/765 |
| 7,010,451 B2 * | 3/2006 | Dorough et al. | 702/117 |
| 7,035,755 B2 * | 4/2006 | Jones et al. | 702/121 |
| 7,043,390 B2 * | 5/2006 | Jones et al. | 702/117 |
| 2003/0105607 A1 * | 6/2003 | Jones et al. | 702/121 |
| 2004/0143411 A1 * | 7/2004 | Wu | 702/117 |

OTHER PUBLICATIONS

English language abstract of Korean Publication No. 1020020013303.

English language abstract of Korean Publication No. 1020020023600.

English language abstract of Korean Publication No. 1020030057209.

* cited by examiner

TEST APPARATUS HAVING MULTIPLE TEST SITES AT ONE HANDLER AND ITS TEST METHOD

This application is a Divisional of U.S. Pat. No. 10/672,994, filed on Sep. 25, 2003 now U.S. Pat. No. 6,903,567, now pending, which claims priority from Korean Patent Application No. 2002-58349, filed on Sep. 26, 2002, the contents of which are herein incorporated by reference in their entirety.

FIELD OF THE INVENTION

The present invention relates to semiconductor device testing, and more particularly to a test apparatus and method involving two test boards that interact with one handler.

BACKGROUND OF THE INVENTION

After all processes are carried out, semiconductor devices are packaged and their functions are electrically tested by means of a tester and handler. The tester, which includes a waveform generator, a current/voltage generator, and a current/voltage-measuring unit, tests the electrical functions of semiconductor devices according to the test program. The handler is a kind of robot that automatically conducts the electrical function test for each semiconductor "device under test" (DUT). The handler is an automated assembly to load/unload the DUTs for testing and to sort the tested DUTs based on the test result. A test station is a place where the tester conducts the electric function test, and a test head is a kind of a gate between the handler and the tester.

A test flow between a tester and a handler head is described below with reference to FIG. 1.

Referring to FIG. 1, a signal is transmitted between a handler head 110 and a tester 120 through a communication interface 130. While chips are moved from the chip tray to the handler head 110, the tester 120 is in an idle state (①). When a chip is connected to a socket, the handler head 110 transmits a test-start signal to the tester 120 (②). The tester 120 tests the electronic function of the chip in response to the test-start signal and transmits a test-end signal to the handler head 110 when the test ends (③). The handler head 110 sorts the tested chips into good chips and defective chips (④). At this time, the tester is again in the idle state. A reduction or elimination of the tester idle time is desirable because it would improve the One example of a test apparatus that reduces tester idle time is disclosed in Korean Patent Application No. 2000-56000, in which a multi-handler has two test points, two sorting means, and two loading lanes, and a test signal is transmitted in a time-division manner to each of the alternate paths of the multi-handler. A test apparatus according to the above patent includes two handlers, two stations, and two head boards. While one semiconductor device is tested at one handler portion, another semiconductor device is sorted and a new semiconductor device is loaded at another handler portion. Unfortunately, because so many of the handler components are duplicated, the test apparatus of the above patent is still fairly large.

SUMMARY OF THE INVENTION

A test apparatus having a relatively small size and yet reduces test idle time, and its test method, are provided.

A first embodiment of the present invention provides a test apparatus for testing a plurality of semiconductor devices loaded on one handler connected to a tester. The handler includes a test head that counts cycles of a test-clock signal provided by the tester and responds by alternately generating an odd-number signal and an even-number signal, and a lateral head board divided into a first site and a second site on which the DUTs are loaded. The tester tests the DUTs loaded on the first site in response to the odd-number signal, and the tester tests the DUTS loaded on the second site in response to the even-number signal.

In a second embodiment, the handler includes a test head that counts cycles of a test-clock signal provided by the tester and responds by alternately generating an odd-number signal and an even-number signal, a first lateral head board on which the DUTs are loaded, and a second lateral head board on which the DUTs are loaded. The tester tests the DUTs loaded on the first head board in response to the odd-number signal, and the tester tests the DUTs loaded on the second head board in response to the even-number signal.

In a third embodiment, the handler includes a test head on which fuses are selectively shorted by a voltage source to alternately generate a first selection signal and a second selection signal, and a head board divided into first and second sites on which the DUTs are loaded. The tester tests the DUTs loaded on the first site in response to the first selection signal, and the tester tests the DUTs loaded on the second site in response to the second selection signal.

In a fourth embodiment, the handler includes a test head on which fuses selectively shorted by a voltage source alternately generate a first selection signal and a second selection signal, a first head board on which the DUTs are loaded, and a second head board on which the DUTs are loaded. The DUTs loaded on the first head board are tested in response to the first selection signal, and the tester tests the DUTs loaded on the second head board in response to the second selection signal.

In a fifth embodiment, the invention provides a method of testing a plurality of semiconductor devices loaded on one handler connected to a tester. The method includes loading the semiconductor devices on two or more sites of the handler's head board, making the handler transmit a test-require signal to the tester, making the tester receive the test-require signal and query the handler as to whether the semiconductor devices are all loaded on a fullsite, making the handler count cycles of a test clock signal from the tester to generate site selection signals for selecting the site, testing the DUTs loaded on a site in response to the corresponding site selection signal, sorting the tested DUTs according to their test results, and selecting another site in response to the site selection signal.

In a sixth embodiment, the method includes loading the semiconductor devices on two or more sites of the handler head board, making the handler transmit a test-require signal to the tester, making the tester receive the test-require signal and query the handler whether the semiconductor devices are loaded on a fullsite, making the handler selectively short embedded fuses to a voltage source to generate site selection signals for selecting the sites, testing the DUTs loaded on a site in response to the corresponding site selection signal, and sorting the tested DUTs according to their test results and selecting another site in response to the site selection signal.

DESCRIPTION OF THE PREFERRED EMBODIMENT

A handler according to a first embodiment of the present invention is now described below with reference to FIG. 2.

Figure 1:
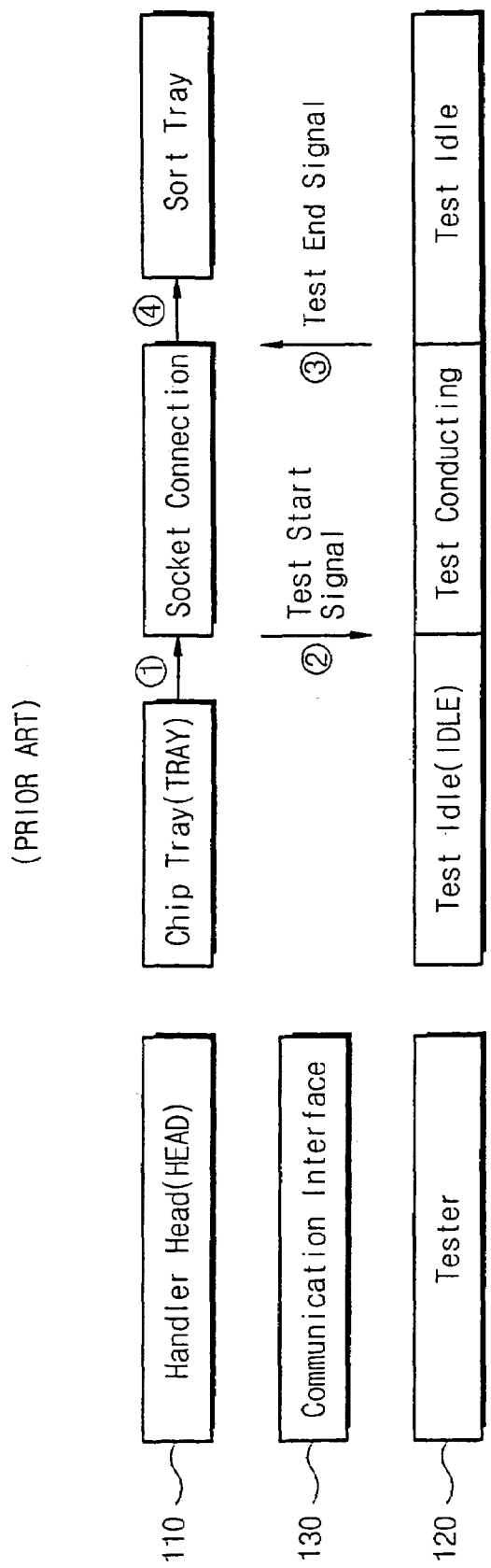
FIG. 1 shows a test flow between a conventional test and a handler.
Figure 2:
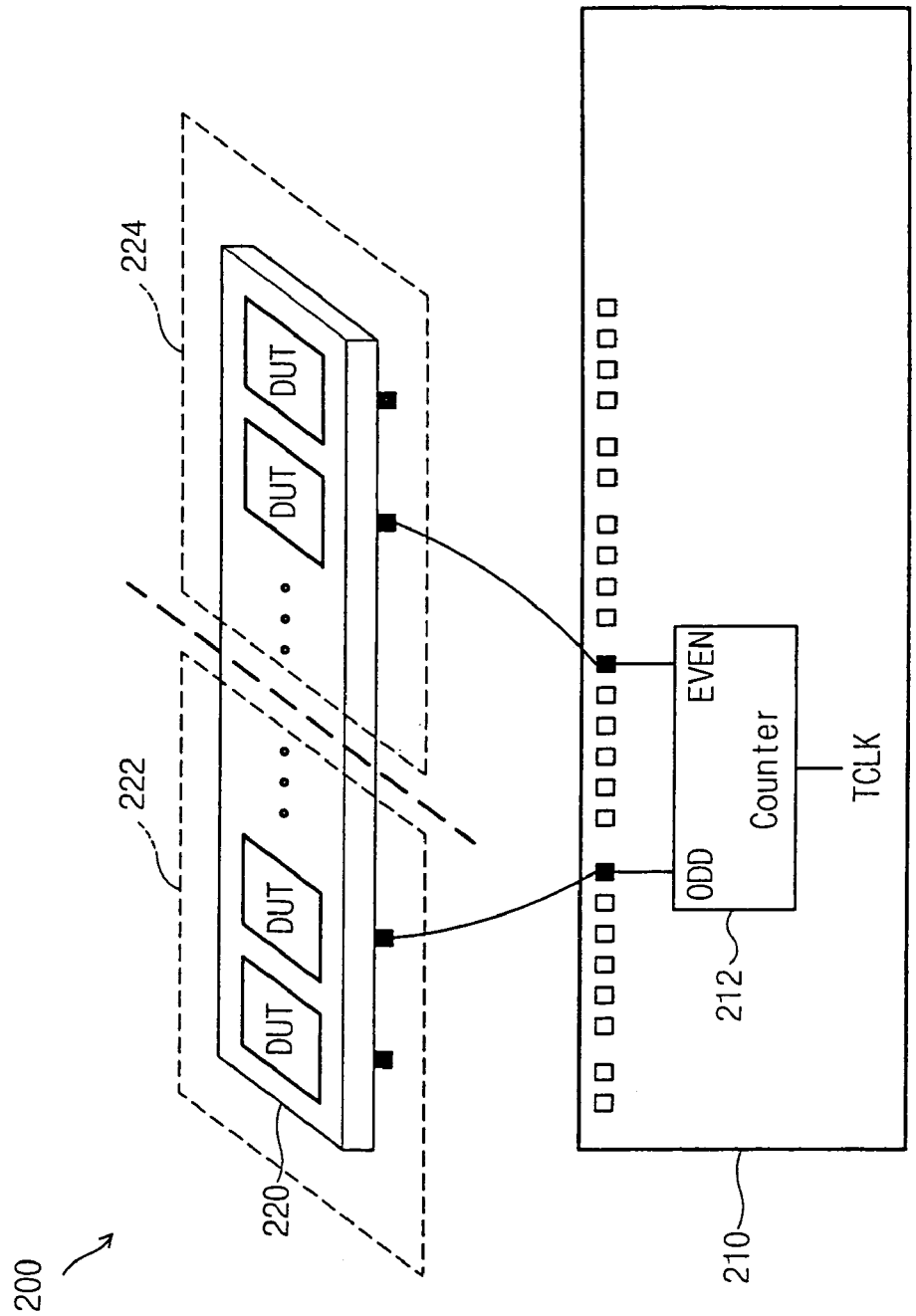
FIG. 2 shows a handler according to a first embodiment of the present invention.

Referring to FIG. 2, a handler 200 is connected to a tester to test a plurality of loaded semiconductor devices DUT. The handler 200 includes a test head 210 and a lateral handler head board 220. The test head 210 has a counter 212 that counts cycles from a test clock signal TCLK provided by the tester and responds by alternately generating an odd-number signal ODD and an even-number signal EVEN. A plurality of DUTs are loaded onto the lateral handler head board 220, which is divided along its width into: a first site 222 and a second site 224,. The tester tests the DUTs loaded on the first site 222 in response to the odd-number signal ODD, and the tester tests the DUTs loaded on the second site 224 in response to the even-number signal EVEN.

The present invention achieves the advantage of reducing or eliminating tester idle time because the handler 200 sorts tested DUTs from, or loads new untested DUTS to, one of the sites on the lateral board while the tester tests DUTs on the other site. Thus, when the tester finishes testing DUTs on one site, it can immediately begin testing the newly loaded DUTs on the other site without intervening idle time. Further, since a single handler loading to and sorting from two sites is connected to the tester, the test apparatus can be conveniently compact.

Although the lateral board 220 is divided into two sites (i.e., the first and second sites 222 and 224) in the first embodiment, it may be divided into three sites or more. Therefore, it will be understood that the test head 210 may divide the test clock signal TCLK into three or more distinguishable timing signals.

A handler according to a second embodiment of the present invention is now described with reference to FIG. 3.

Figure 3:
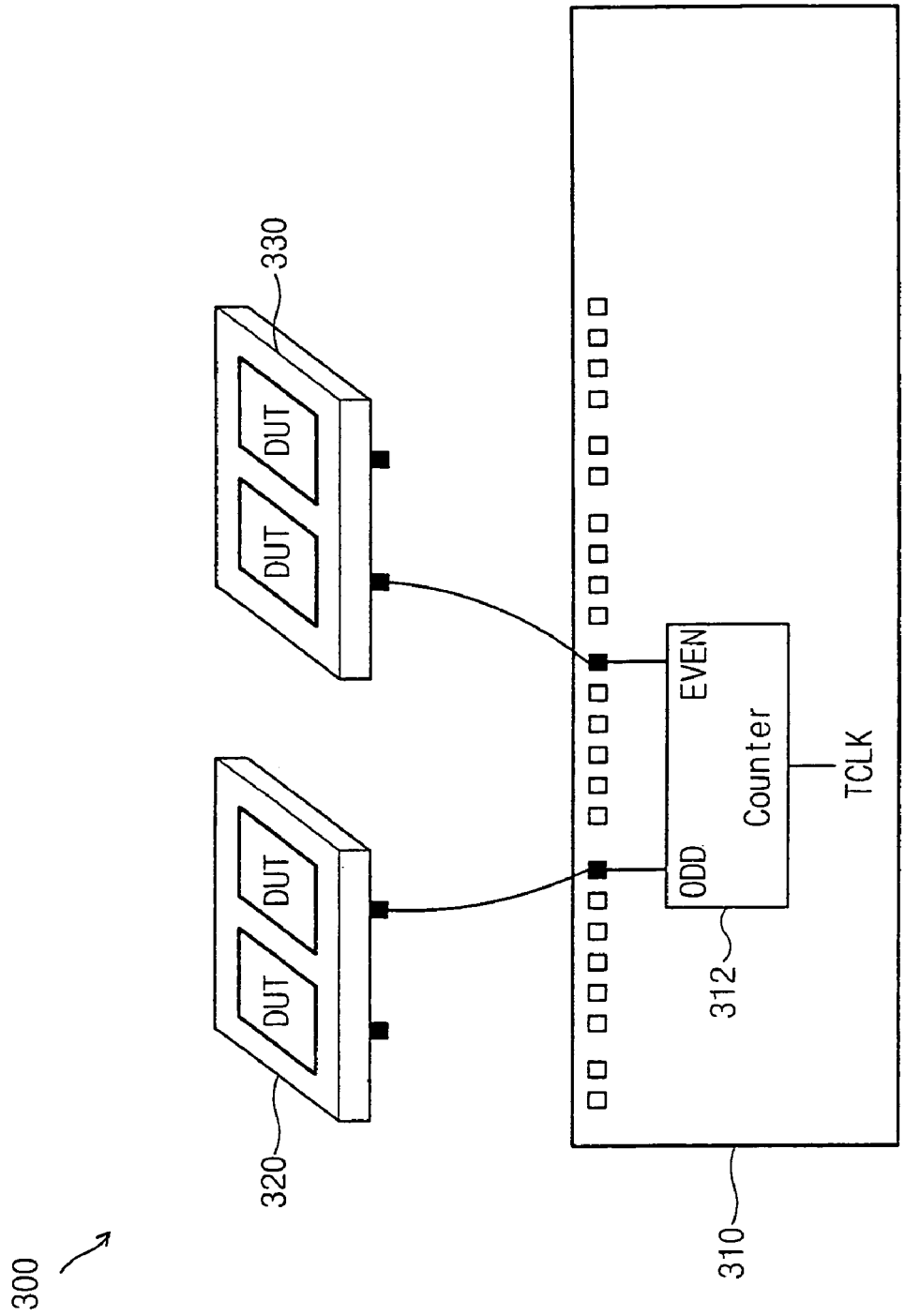
FIG. 3 shows a handler according to a second embodiment of the present invention.

Referring to FIG. 3, a handler 300 includes a test head 310, a first test board 320, and a second test board 330. The test head 310 is identical with the test head 210 of FIG. 2, with a counter 312 that counts cycles of a test clock signal TCLK from the tester and responds by alternately generating an odd-number signal ODD and an even-number signal EVEN. Unlike the sites 222 and 224 on the same lateral board 220 of FIG. 2, the sites in this second embodiment are on two separate test boards 320 and 330. A plurality of DUTs are loaded onto each of the test boards 320 and 330. The first test board 320 tests DUTs in response to the odd-number signal ODD, and the second test board 330 tests semiconductor devices in response to the even-number signal EVEN.

A handler according to a third embodiment of the present invention is now described with reference to FIG. 4.

Figure 4:
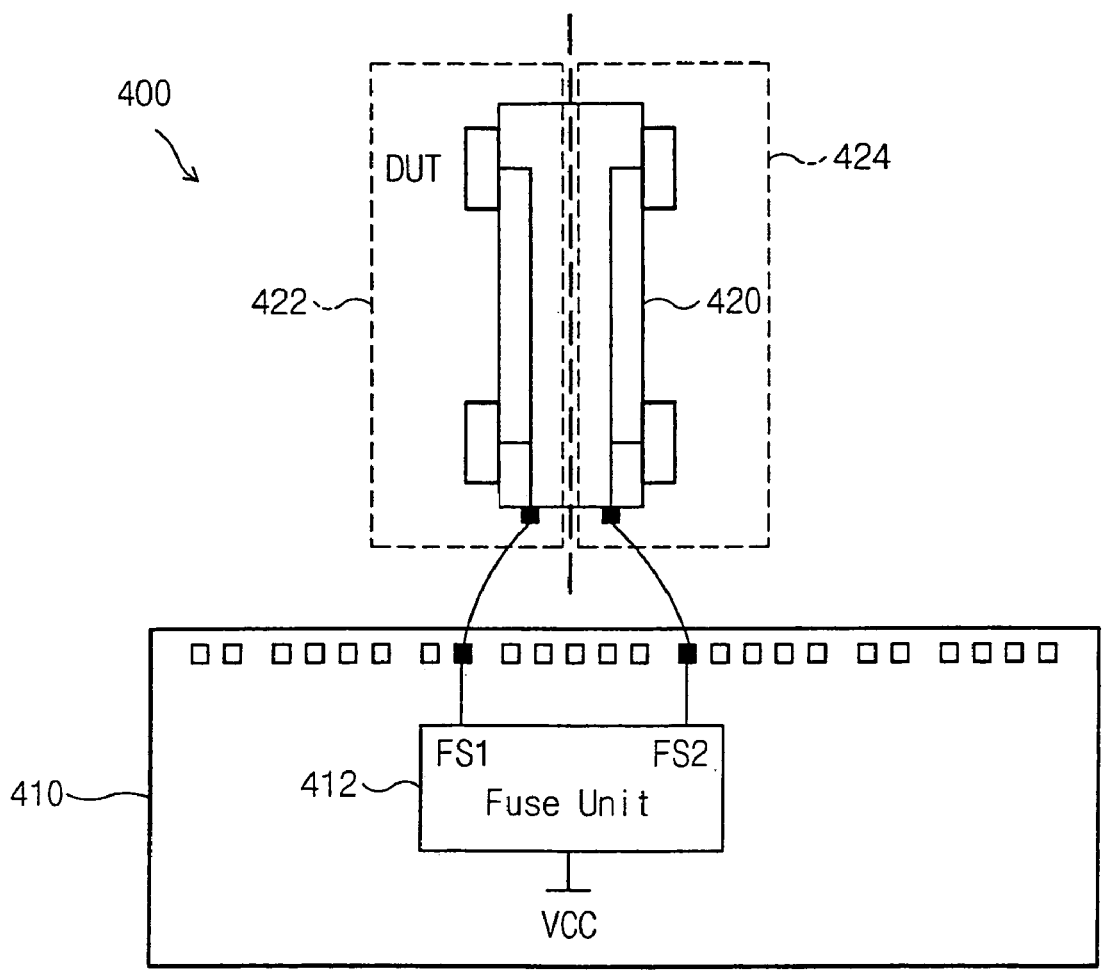
FIG. 4 shows a handler according to a third embodiment of the present invention.

Referring to FIG. 4, a handler 400 includes a test head 410 and a vertical board portion 420. The test head 410 has a fuse unit 412 which selectively connects internal fuses to a voltage source VCC, generating either a first selection signal FS1 or a second selection signal FS2 depending on whether an internal fuse is shorted. Like the lateral handler head board 220 of FIG. 2, the vertical handler head board 420 is divided into a first site 422 and a second site 424, but the vertical configuration of FIG. 4 allows the location of sites 422 and 424 on opposite surfaces of the handler head board. DUTs loaded on the first site 422 are tested in response to the first selection signal FS1, and DUTs loaded on the second site 424 are tested in response to the second selection signal FS2.

Although the vertical board portion 420 is divided into two sites (i.e., the first and second sites 422 and 424) in the third embodiment, it may be divided into three sites or more. Therefore, the fuse unit may have a plurality of fuses to generate various selection signals and to selectively test semiconductor devices in a corresponding site.

A handler according to a fourth embodiment of the present invention is now described with reference to FIG. 5.

Figure 5:
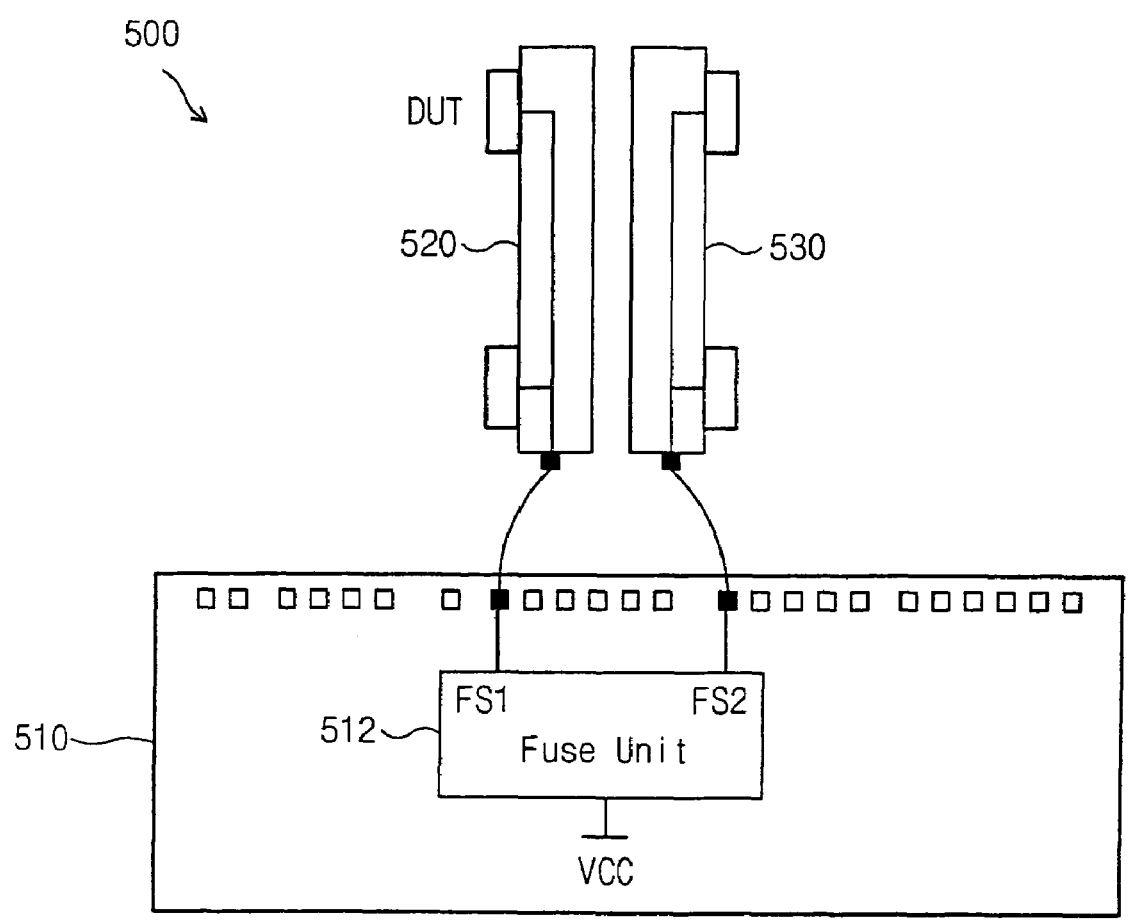
FIG. 5 shows a handler according to a fourth embodiment of the present invention.

Referring to FIG. 5, a handler 500 includes a test head 510, a first test board 520, and a second test board 530. The test head 510 has a fuse unit 512. Similar to the test head 410 of FIG. 4, the test head 510 generates a first selection signal FS1 or a second selection signal FS2 depending on whether a fuse in the fuse unit 512 is shorted. DUTs loaded on the first test board 520 are tested in response to the first selection signal FS1, and DUTs loaded on the second test board 530 are tested in response to the second selection signal FS2.

A test flow between a tester and a handler according to the present invention is now described with reference to FIG. 6.

Figure 6:
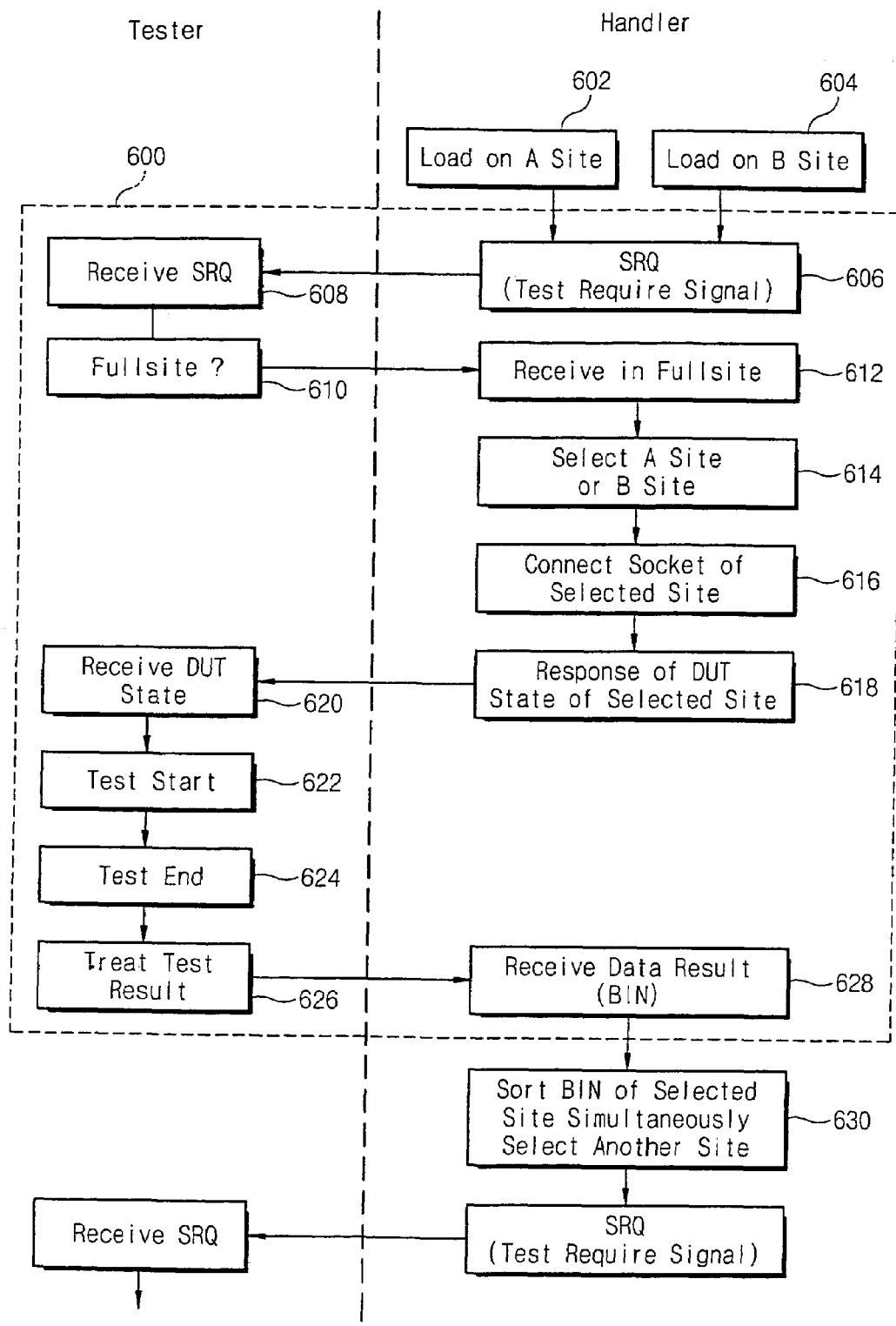
FIG. 6 shows a flowchart of a test method between a tester and a handler according to the present invention.

Referring to FIG. 6, DUTs are loaded on an A site (602) and a B site (604) of a handler. The handler transmits a test require signal SRQ (606) to a tester. After receiving the test require signal SRQ (608), the tester queries the handler whether the semiconductor devices in the A site and the B site are all loaded on a fullsite (610). The handler receives the fullsite query (612), selects either the A site or the B site (614), and connects a DUT from the selected site to the tester socket (616). The DUT state signal is transmitted from the selected site (618) and received by the tester (620). The tester tests the DUT (622 and 624) and treats the test result (626). The handler receives the test result (BIN) (628), sorts good devices and bad devices from the selected site and simultaneously selects another site (630). To test DUTs on the newly selected site, the handler transmits the test require signal SRQ to the tester and the subroutine (600) is repeated for the new site.

As explained so far, a test apparatus includes one handler connected to a tester, and either one test board divided into two or more sites, or two or more separate test boards. Since the test apparatus needs only a single loading lane, a single tester, and a single sorter, and only the test boards or test sites need to be multiple, the apparatus may be conveniently compact. Further, the apparatus can test DUTs in one site or on one test board while simultaneously sorting DUTs according to their test results in another site or on another test board. This enhances the efficiency of testing by reducing or eliminating tester idle time.

While the present invention has been described with reference to its preferred embodiments, various alterations and modifications will occur to those skilled in the art. All such alterations and modifications may be made within the scope and spirit of the appended claims.

What is claimed is:

1. A test apparatus for testing a plurality of semiconductor devices loaded on one handler connected to a tester, the handler comprising:

a head board containing at least first and second head board sites, each of the at least first and second head board sites capable of being loaded with semiconductor devices to be tested; and a test head to generate site selection signals corresponding to different ones of the head board sites for sequential test cycles, wherein semiconductor devices loaded on the first head board site are tested in response to one site selection signal while the second head board site is being loaded, and semiconductor devices loaded on the second head board site are tested in response to another site selection signal;

wherein the test head counts test cycles provided from the tester to generate different site selection signals.

2. The test apparatus of claim 1, wherein while semiconductor devices loaded on the second head board site are tested, the first head board site is being loaded.

3. A test apparatus for testing a plurality of semiconductor devices loaded on one handler connected to a tester, the handler comprising:

a head board containing at least first and second head board sites, each of the at least first and second head board sites capable of being loaded with semiconductor devices to be tested; and a test head to generate site selection signals corresponding to different ones of the head board sites for sequential test cycles, wherein semiconductor devices loaded on the first head board site are tested in response to one site selection signal, and semiconductor devices loaded on the second head board site are tested in response to another site selection signal;

wherein the test head includes a plurality of fuses, wherein different fuses are selectively shorted to a power supply voltage to selectively generate different site selection signals.

4. A test apparatus for testing a plurality of semiconductor devices loaded on one handler connected to a tester, the handler comprising:

a head board containing at least first and second head board sites, each of the at least first and second head board sites capable of being loaded with semiconductor devices to be tested; and a test head to generate site selection signals corresponding to different ones of the head board sites for sequential test cycles, wherein semiconductor devices loaded on the first head board site are tested in response to one site selection signal, and semiconductor devices loaded on the second head board site are tested in response to another site selection signal;

wherein the handler has the capability to sort, according to a test result obtained for the first head board site, semiconductor devices loaded on the first head board site while semiconductor devices loaded on the second head board site are selectively tested in response to the site selection signal corresponding to the second head board site.

* * * * *